(12) United States Patent
Tutuc et al.

(10) Patent No.: US 10,651,271 B2
(45) Date of Patent: May 12, 2020

(54) CHARGE COMPENSATION SEMICONDUCTOR DEVICES

(71) Applicant: Infineon Technologies Austria AG, Villach (AT)

(72) Inventors: Daniel Tutuc, St. Niklas an der Drau (AT); Christian Fachmann, Fuernitz (AT); Franz Hirler, Isen (DE); Maximilian Treiber, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/216,831

(22) Filed: Dec. 11, 2018

(65) Prior Publication Data

US 2019/0123137 A1 Apr. 25, 2019

Related U.S. Application Data

(62) Division of application No. 15/682,874, filed on Aug. 22, 2017, now Pat. No. 10,157,982.

(30) Foreign Application Priority Data

Aug. 25, 2016 (DE) .................. 10 2016 115 806

(51) Int. Cl.
*H01L 21/265* (2006.01)
*H01L 29/06* (2006.01)
(Continued)

(52) U.S. Cl.
CPC ...... *H01L 29/0634* (2013.01); *H01L 21/2253* (2013.01); *H01L 29/0615* (2013.01);
(Continued)

(58) Field of Classification Search
CPC ........... H01L 21/2253; H01L 21/26513; H01L 21/324; H01L 29/0619; H01L 29/0634;
(Continued)

(56) References Cited

U.S. PATENT DOCUMENTS

| 2014/0197477 A1* | 7/2014 | Onishi | H01L 29/7811 |
| | | | 257/329 |
| 2015/0187874 A1* | 7/2015 | Hirler | H01L 21/266 |
| | | | 257/139 |
| 2015/0380542 A1* | 12/2015 | Weyers | H01L 29/0634 |
| | | | 257/329 |

FOREIGN PATENT DOCUMENTS

| DE | 102010060229 A1 | 5/2011 |
| DE | 102015107444 A1 | 11/2015 |
| DE | 102015110112 A1 | 12/2015 |

* cited by examiner

*Primary Examiner* — Shahed Ahmed
(74) *Attorney, Agent, or Firm* — Murphy, Bilak & Homiller, PLLC (57) ABSTRACT

A method for forming a field-effect semiconductor device includes providing a wafer having a substantially compensated semiconductor layer extending to an upper side and including a semiconductor material which is co-doped with n-type dopants and p-type dopants. A peripheral area laterally surrounding an active area are defined in the wafer. Trenches in the active area are filled with a substantially intrinsic semiconductor material. More p-type dopants than n-type dopants are diffused from the compensated semiconductor layer into the intrinsic semiconductor material to form a plurality of p-type compensation regions in the trenches which are separated from each other by respective n-type drift portions. P-type dopants are introduced at least into a semiconductor zone of the peripheral area, so that the semiconductor zone and a dielectric layer on the upper side form an interface. A horizontal extension of the interface is larger than a vertical extension of the trenches.

20 Claims, 7 Drawing Sheets

(51) Int. Cl.
*H01L 29/40* (2006.01)
*H01L 21/225* (2006.01)
*H01L 29/10* (2006.01)
*H01L 29/66* (2006.01)
*H01L 29/78* (2006.01)
*H01L 21/324* (2006.01)

(52) U.S. Cl.
CPC ...... *H01L 29/0619* (2013.01); *H01L 29/1095* (2013.01); *H01L 29/402* (2013.01); *H01L 29/404* (2013.01); *H01L 29/66712* (2013.01); *H01L 29/7811* (2013.01); *H01L 21/26513* (2013.01); *H01L 21/324* (2013.01)

(58) Field of Classification Search
CPC ............. H01L 29/1095; H01L 29/0615; H01L 29/0852; H01L 29/7823; H01L 29/0696; H01L 29/66325; H01L 29/7393; H01L 2924/13055; H01L 29/66712–66734; H01L 29/7802–7815
See application file for complete search history.

CHARGE COMPENSATION SEMICONDUCTOR DEVICES

TECHNICAL FIELD

Embodiments of the present invention relate to semiconductor devices having a charge compensation structure, in particular to power semiconductor field-effect transistors having a charge compensation structure and an edge-termination structure.

BACKGROUND

Semiconductor transistors, in particular field-effect controlled switching devices such as a Metal Oxide Semiconductor Field Effect Transistor (MOSFET) or an Insulated Gate Bipolar Transistor (IGBT), have been used for various applications including but not limited to use as switches in power supplies and power converters, electric cars, air-conditioners, and even stereo systems. Particularly with regard to power devices capable of switching large currents and/or operating at higher voltages, low on-state resistance Ron, high breakdown voltages $U_{bd}$ in a blocking mode, high robustness and/or good softness are often desired.

To achieve low on-state resistance Ron and high breakdown voltages $U_{bd}$, compensation semiconductor devices were developed. The compensation principle is based on a mutual compensation of charges in n- and p-doped regions, which are often also referred to as n- and p-doped pillar regions, in the drift zone of a vertical MOSFET.

Typically, the charge compensation structure formed by p-type and n-type regions is arranged below the actual MOSFET-structure, with its n-type source, p-type body regions and gate regions, and also below the associated MOS-channels that are arranged next to one another in the semiconductor volume of the semiconductor device or interleaved with one another in such a way that, in the off-state, their charges can be mutually depleted and that, in the activated state or on-state, there results an uninterrupted, low-impedance conduction path from a source electrode near the surface to a drain electrode arranged on the back side.

By virtue of the compensation of the p-type and n-type dopings, the doping of the current-carrying region can be significantly increased in the case of compensation components, which results in a significant reduction of the on-state resistance Ron despite the loss of a current-carrying area. The reduction of the on-state resistance Ron of such semiconductor power devices is associated with a reduction of the heat generated by the current in the on-state, so that such semiconductor power devices with charge compensation structure remain "cool" compared with conventional semiconductor power devices.

To achieve high breakdown voltages $U_{bd}$, an edge-termination structure may be used in a peripheral area surrounding the active area with active MOSFET-cells. However, the peripheral area requires chip area and thus increases costs. Further, it is often desired for charge compensation MOSFETs that the electric field strength in the peripheral area is low at the semiconductor surface and that the peripheral area has a higher reverse blocking capability than the active area. For n-channel charge compensation MOSFETs, a combination of a buried p-type JTE (Junction Termination Extension)—region and an n-type JTE-region arranged on the p-type JTE has been found to allow tuning the breakdown behavior of the peripheral area by varying the doping concentration of the n-type JTE-region. Depending on manufacturing processes for the compensation structure, adjusting the doping concentration of the n-type JTE-region may be laborious.

Accordingly, there is a need to improve manufacturing of charge compensation semiconductor devices.

SUMMARY

According to an embodiment of a field-effect semiconductor device, the field-effect semiconductor device includes a semiconductor body having a first side. The semiconductor body includes an edge delimiting the semiconductor body in a direction substantially parallel to the first side, an active area, a peripheral area arranged between the active area and the edge, and a first semiconductor region of a first conductivity type extending in the peripheral area to the first side. A source metallization is arranged on the first side. A drain metallization is arranged opposite the source metallization and in Ohmic connection with the first semiconductor region. In the active area, the semiconductor body further includes a plurality of drift portions of the first conductivity type alternating with compensation regions of a second conductivity type. The drift portions are in Ohmic connection with the drain metallization. The compensation regions are in Ohmic connection with the source metallization. In the peripheral area, the semiconductor body further includes an edge termination region of the second conductivity type arranged at the first side and in Ohmic connection with the source metallization, and a dielectric layer arranged at the first side and forming a first interface with the edge termination region and a second interface with the first semiconductor region. In a vertical cross-section perpendicular to the first side, a first extension of the first interface is, in a horizontal direction parallel to the first side, larger than a second extension of the second interface in the horizontal direction.

According to an embodiment of a field-effect semiconductor device, the field-effect semiconductor device includes a first semiconductor region of a first conductivity type, a first side, an edge delimiting the semiconductor body in a direction substantially parallel to the first side, an active area, and a peripheral area arranged between the active area and the edge. A first metallization is arranged on the first side. A second metallization is arranged opposite the first metallization and in Ohmic connection with the first semiconductor region. In the active area, the semiconductor body further includes a plurality of drift portions of the first conductivity type alternating with compensation regions of a second conductivity type. The drift portions are in Ohmic connection with the first semiconductor region. The compensation regions are in Ohmic connection with the first metallization. In the peripheral area, the semiconductor body further includes an edge termination region of the second conductivity type in Ohmic connection with the first metallization and having at the first side, in a horizontal direction parallel to the first side, a horizontal extension which is larger than an extension of the compensation regions in a vertical direction perpendicular to the first side.

According to an embodiment of method for forming a field-effect semiconductor device, the method includes providing a wafer including an upper side and a substantially compensated semiconductor layer extending to the upper side and made of a semiconductor material which is co-doped with n-type dopants and p-type dopants. An active area and a peripheral area surrounding the active area when seen from above are defined. In the active area, trenches having, in a vertical direction perpendicular to the upper side, a vertical extension are formed from the upper side into the compensated semiconductor layer. The trenches are filled with a substantially intrinsic semiconductor material. More p-type dopants than n-type dopants are diffused from the substantially compensated semiconductor layer into the intrinsic semiconductor material of the trenches, thereby a plurality of p-type compensation regions, which are separated from each other by respective n-type drift portions, are formed in the trenches. A dielectric layer is formed on the upper side. P-type dopants are introduced at least into a semiconductor zone of the peripheral area. The method is performed so that the semiconductor zone and the dielectric layer form an interface having, in a vertical cross-section and in a horizontal direction parallel to the upper side, a horizontal extension which is larger than the vertical extension of the trenches.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal side of a semiconductor substrate or body. This can be for instance the surface of a wafer or a die.

The term "vertical" as used in this specification intends to describe an orientation which is substantially arranged perpendicular to the first side, i.e. parallel to the normal direction of the first surface of the semiconductor substrate or body. Likewise, the term "horizontal" as used in this specification intends to describe an orientation which is substantially arranged parallel to the first side.

In this specification, a second side of a semiconductor substrate of semiconductor body is considered to be formed by the lower or backside side or surface while the first side is considered to be formed by the upper, front or main side or surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^−$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to field-effect semiconductor devices, in particular to field-effect compensation semiconductor devices and manufacturing methods therefor. Within this specification the terms "semiconductor device" and "semiconductor component" are used synonymously. The field-effect semiconductor device is typically a vertical semiconductor device such as a vertical MOSFET with a source metallization and an insulated gate electrode arranged on the first surface and a drain metallization arranged on a second surface arranged opposite to the first surface. Typically, the field-effect semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range and/or voltages of more than about 10 V or even more than about 100 V or 500 V. Within this specification the terms "power semiconductor device" and "power semiconductor component" are used synonymously.

The terms "substantially intrinsic semiconductor material" and "substantially intrinsic semiconductor region" as used in this specification intend to describe a semiconductor material and a semiconductor region, respectively, having a doping concentration of at most $10^{14}$ cm$^{-3}$, e.g. a doping concentration in a range from about $10^{13}$ cm$^{-3}$ to about $10^{14}$ cm$^{-3}$.

The terms "compensated semiconductor layer" and "compensated semiconductor region" as used in this specification intend to describe a semiconductor layer and a semiconductor region, respectively, comprising both (electron) donors and (holes) acceptors as impurities so that a ratio between a number of electrons provided by the donors and a number of holes provided by the acceptors is in a range from about 0.95 to about 1.05, more typically in a range from about 0.98 to about 1.02, and even more typically in a range from about 0.99 to about 1.01. Typically, any excess or shortage of electrons provided by the donors per volume is, compared to holes provided by the acceptors per volume, lower than about $5*10^{14}$ cm$^{-3}$, more typically at most about $10^{14}$ cm$^{-3}$, at least on average.

The term "edge-termination structure" as used in this specification intends to describe a structure that provides a transition region in which the high electric fields around an active area of the semiconductor device change gradually to the potential at or close to the edge of the device and/or between a reference potential such as ground and a high voltage e.g. at the edge and/or backside of the semiconductor device. The edge-termination structure may, for example, lower the field intensity around a termination region of a rectifying junction by spreading the electric field lines across the termination region.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region may be formed and/or controlled between a source region of the first conductivity type and a drift region of the first conductivity type. The drift region may be in contact with a drain region. The drift region and the drain region are in low Ohmic connection, e.g. in low Ohmic contact with a drain electrode (drain metallization). The source region is in low Ohmic connection with a source electrode (source metallization).

In the context of the present specification, the term "in Ohmic connection" intends to describe that there is an ohmic current path, e.g. a low-ohmic current path, between respective elements or portions of a semiconductor device when no voltages or only small probe voltages are applied to and/or across the semiconductor device. Within this specification the terms "in Ohmic connection", "in resistive electric connection", "electrically coupled", and "in resistive electric connection" are used synonymously. In the context of the present specification, the term "in Ohmic contact" intends to describe that two elements or portions of a semiconductor device are in direct mechanical contact and in Ohmic connection.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include or comprise electrical conductive materials like e.g. metal, alloys, doped polycrystalline semiconductors and metal semiconductor compounds like metal silicides.

In the context of the present specification, the term "gate electrode" intends to describe an electrode which is situated next to, and insulated from the body region and configured to form and/or control a channel region through the body region.

In the context of the present specification, the term "field electrode" intends to describe an electrode which is arranged next to a semiconductor region, typically the drift region, partially insulated from the semiconductor region, and configured to expand a depleted portion in the semiconductor region by charging to an appropriate voltage, typically a negative voltage with regard to the surrounding semiconductor region for an n-type semiconductor region.

In the context of the present specification, the term "mesa" or "mesa region" intends to describe a semiconductor region between two adjacent trenches extending into the semiconductor substrate or body in a vertical cross-section.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. In the context of the present specification, a semiconductor region or layer is typically a monocrystalline semiconductor region or layer, if not stated otherwise.

Figure 1:
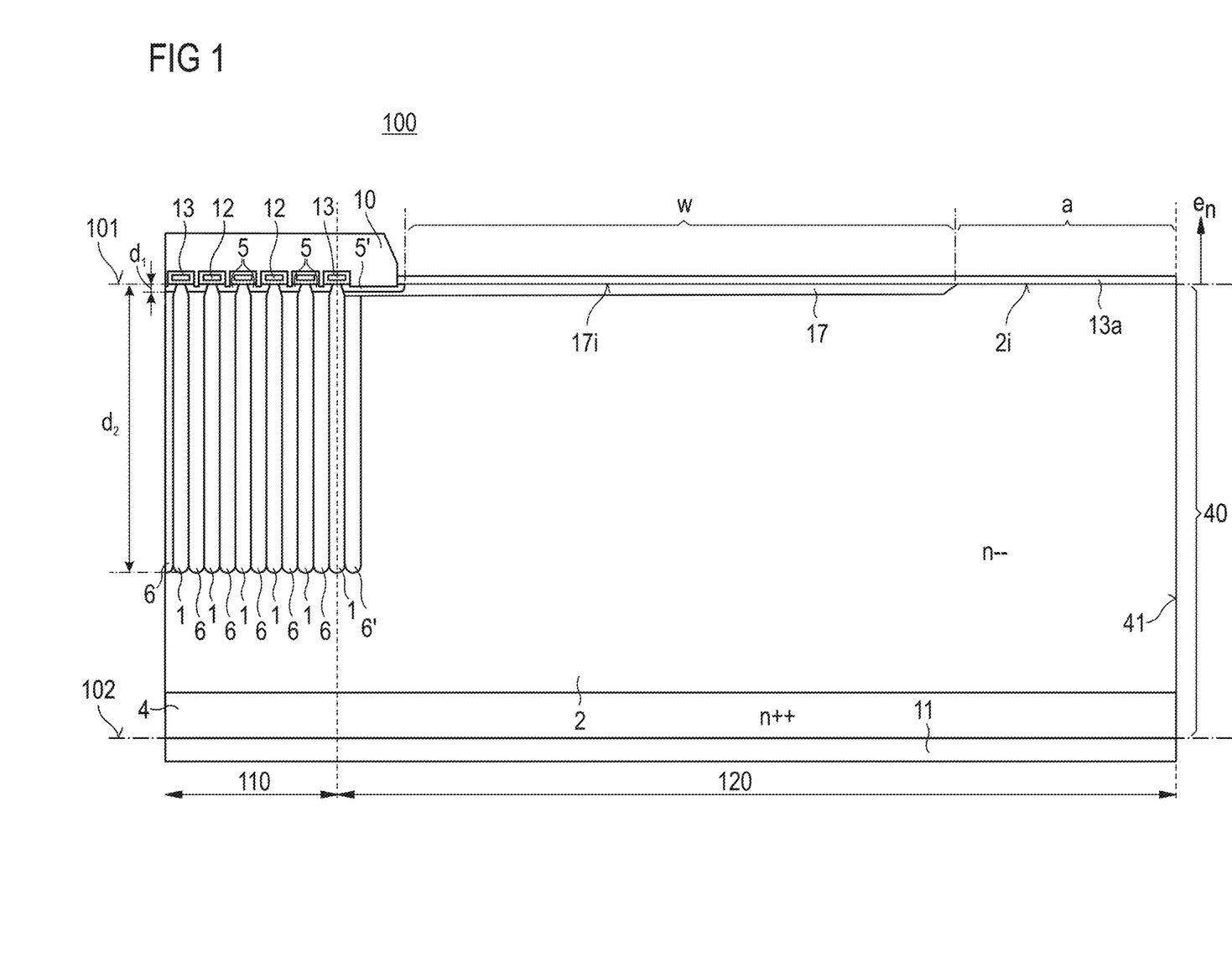
FIG. 1 illustrates a vertical cross-section through a field-effect semiconductor device according to an embodiment.

With reference to FIG. 1, a first embodiment of a field-effect semiconductor device 100 is explained. FIG. 1 illustrates a vertical cross-section through a semiconductor body 40 of the semiconductor device 100. The semiconductor body 40 extends between a first surface 101, facing a vertical direction $e_n$, and a second surface 102 arranged opposite to the first surface 101. In a horizontal direction parallel to the first surface 101, the semiconductor body 40 is delimited by an edge 41, for example a sawing edge. The semiconductor body has an active area 110 and a peripheral area 120 arranged between the active area and the edge 41.

Typically, FIG. 1 illustrates only a right portion of the semiconductor device 100. For example, the peripheral area 120 may surround the active area 110 when seen from above.

A source metallization 10 is arranged on the first surface 101. A drain metallization 11 is arranged on the second surface 102, i.e. opposite to the source metallization 10. In the active area 110, a plurality of gate electrodes 12 are typically also arranged on the first surface 101 and insulated from the source metallization 10 and the semiconductor body 40 by a dielectric region 13, e.g. formed by a thermal oxide or a deposited oxide. The gate electrodes 12 are connected to a gate metallization that is not shown in FIG. 1. Accordingly, the semiconductor device 100 may be operated as a three-terminal device. In the following, the source metallization 10 and the drain metallization 11 are also referred to as first metallization 10 and second metallization 11, respectively.

In the exemplary embodiment illustrated in FIG. 1, the semiconductor body 40 includes a typically low n-doped first semiconductor region 2 extending in the peripheral area 120 to the first side 101 and a highly doped n-type drain region 4 that extends to the second surface 102 and forms an Ohmic contact with the drain metallization 11. The first semiconductor region 2 is typically a co-doped semiconductor region. Further, the first semiconductor region 2 may be a substantially compensated semiconductor region. The first semiconductor region 2 may even be a substantially un-doped semiconductor region. The drain region 4 is typically arranged in the active area 110 and the peripheral area 120 and may extend to the edge 41.

The first semiconductor region 2 may also be arranged in the active area 110 and the peripheral area 120. For example, the first semiconductor region 2 may, in the active area 110, be arranged between the drain region 4 and the compensation structure 1, 6. Further, the first semiconductor region 2 may extend to the edge 41.

In the active area 110, a plurality of alternating n-type drift portions 1 and p-type compensation regions 6 forming respective pn-junctions with each other are arranged. The drift portions 1 are in Ohmic connection with the drain metallization 11 (in the exemplary embodiment via the adjoining first semiconductor region 2 and the drain region 4), and typically extend to the first surface 101 in the active area 110. For sake of clarity, only a few drift portions 1 and compensation regions 6 are illustrated in FIG. 1.

As illustrated by the vertical dashed line, the drift portion 1 that is closest to the edge 41 also contributes to the forward current of the exemplary field-effect semiconductor device 100, however, to a lesser extend compared the other drift portions 1. This is due to a missing source region in an outermost body region 5' of the p-type body regions 5, 5' each of which is arranged above a respective compensation region 6, 6'.

The active area 110 may be defined by the presence of source regions (not shown in FIG. 1) and insulated gate electrodes 12.

According to an embodiment, the doping concentrations of the p-type compensation regions 6 and the drift portions 1 are chosen such that, in the off-state, their charges can be mutually depleted and that, in the on-state, an uninterrupted, low-resistive conduction path can be formed from the source metallization 10 to the drain metallization 11.

At least the first semiconductor region 2, the drift portions 1 and the compensation regions 6 are typically co-doped semiconductor regions, i.e. semiconductor regions that are doped with impurities acting as donors, for example antimony or arsenic atoms, and impurities acting as acceptors, for example boron atoms. However, in a co-doped n-type semiconductor region or layer, the (electrically active) n-type dopants outweigh the (electrically active) p-type dopants. Typically, co-doped n-type semiconductor regions and layers have an excess of donors and thus an n-type net-doping. Likewise, the (electrically active) p-type dopants outweigh the (electrically active) n-type dopants in a co-doped p-type semiconductor region or layer. Typically, co-doped p-type semiconductor regions and layers have an excess of acceptors and thus a p-type net-doping.

The n-type net-doping of the first semiconductor region 2 is typically lower than a first maximum (net-) doping concentration of the drain region 4, typically by at least a factor of five, more typically by at least a factor of about ten, even more typically by a factor of at least about 20, even more typically by a factor of at least about 50, for example by a factor of at least about 100.

The drift portions 1 have a first maximum net-doping concentration, which is typically higher than the maximum net-doping concentration of the first semiconductor region 2.

Typically, an (mathematically) integrated net-doping concentration of n-type dopants of the drift portions 1 substantially matches an (mathematically) integrated net-doping concentration of p-type dopants of the compensation regions 6. For example, a relative difference between the integrated net-doping concentration of n-type dopants of the drift portions 1 and the integrated net-doping concentration of p-type dopants of the compensation regions 6 is typically below 10%, more typically below 5% or even 1%.

The drift portions 1 and the compensation regions 6 may be formed as respective substantially vertically orientated pillars. In the vertical cross-section, the drift portions 1 and the p-type compensation regions 6 may be formed as substantially vertically orientated strip-type parallelepipeds, for example as rectangles, or as isosceles trapezoids. In the following, the n-type drift portions 1 and the p-type compensation regions 6 are also referred to as n-type pillar regions 1 and p-type pillar regions 6.

Figure 2:
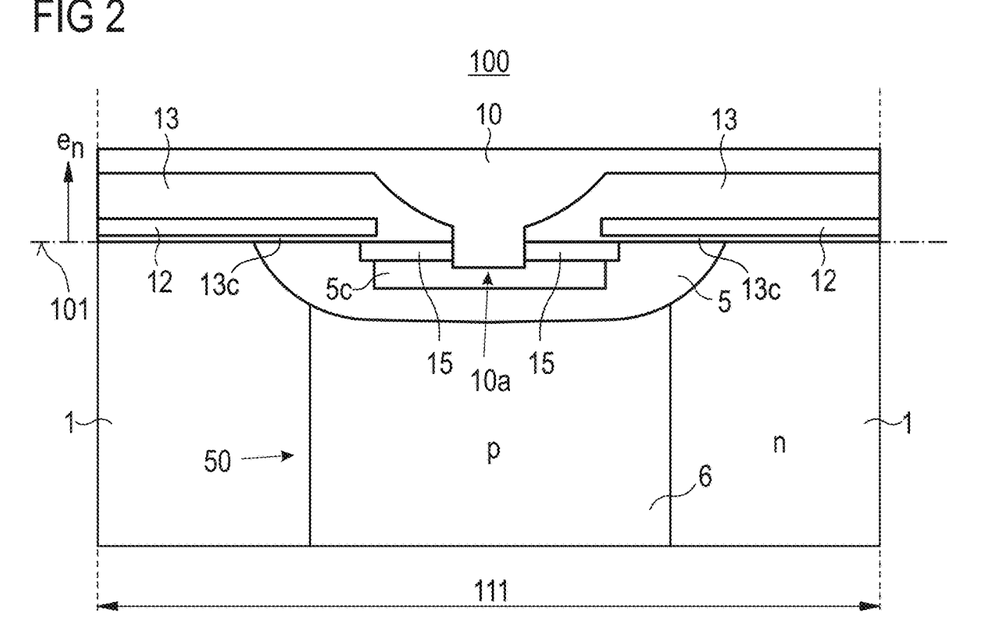
FIG. 2 illustrates an enlarged vertical section of a field-effect cell of a field-effect semiconductor device similar to the semiconductor device illustrated in FIG. 1 according to an embodiment.

As explained in more detail with regard to FIG. 2 illustrating an enlarged upper section of the semiconductor device 100 illustrated in FIG. 1, the compensation regions 6 are in Ohmic connection with the source metallization 10. The illustrated section of FIG. 2 typically corresponds to an upper part of one of a plurality of unit cells 111 in the active area 110 of the semiconductor device 100.

In the exemplary embodiment, a $p^+$-type body contact region 5c and two $n^+$-type source regions 15 are formed in a p-type body region 5. Further, an optional $p^+$-type contact region 6c extends between the body contact region 5c and the compensation region 6. A portion 13c of the dielectric region 13 is arranged between the first surface 101 and each of the gate electrodes 12, and extends in a horizontal direction from the drift portion 1 along the body region 5 at least to the source region 15 so that an inversion channel, which is also referred to herein as MOS-channel, may be formed by the field-effect in a channel region of the body region 5 along the portion(s) 13c forming a gate dielectric region. Accordingly, the semiconductor device 100 may be operated as a MOSFET.

The remaining portion of the dielectric region 13 may form an interlayer dielectric between the source metallization 10 and gate electrode 12 and first surface 101, respectively.

In the exemplary embodiment, the source metallization 10 is electrically contacted with the source regions 15 and the body contact region 5c via a shallow trench contact 10a formed through the interlayer dielectric 13 and into the semiconductor body 40. In other embodiments, the source metallization 10 electrically contacts the source region 15 and the body contact region 5c substantially at the first surface 101.

According to another embodiment, the gate electrode(s) 12 and gate dielectric(s) 13c may be formed in a respective shallow trench extending from the first surface 101 into the semiconductor body 40. In this embodiment, the body region 5 and source regions 15 adjoin an upper part of the respective shallow trench while the drift portions 1 adjoin a lower part of the respective trench. In this embodiment, the drift portions 1 may not extend to the first surface 101 in the active area 110.

Typically, the compensation region 6 is formed in a trench 50 and the drift portions 1 are formed by or in adjacent mesas of the semiconductor body 40.

Figure 3:
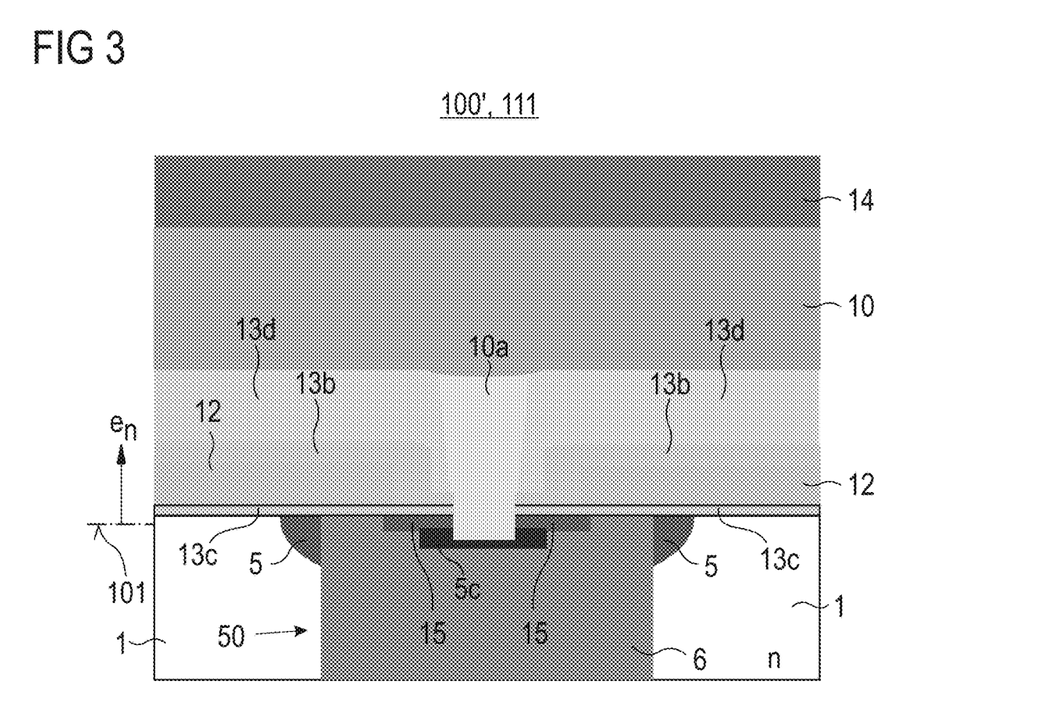
FIG. 3 illustrates an enlarged vertical section of a field-effect cell of a field-effect semiconductor device similar to the semiconductor device illustrated in FIG. 1 according to an embodiment.

Depending on manufacturing, the trench 50 may be spaced apart from the first surface 101 or extend from the first surface 101 into the semiconductor body 40 as illustrated in FIG. 3 illustrating a unit cell 111 of a field-effect semiconductor device 100' which is similar to the semiconductor device 100.

The trench 50 may have (substantially) vertically orientated sidewalls, but may also be tapered.

As shown in FIG. 3, the interlayer dielectric 13 formed on the gate oxide layer 13c may include two dielectric layers 13b, 13d. The gate oxide layer 13c and the dielectric layers 13b, 13d may be made of any suitable dielectric material such as silicon oxide ($SiO_2$), silicon nitride ($Si_3N_4$) and silicon oxynitride ($SiO_xN_y$), TEOS (TetraEthylOrthoSilicat), USG (Undoped Silicate Glass), an HDP-oxide (High Density Plasma-oxide) or a doped oxide, for example PSG (PhosphoSilicate Glass), BPSG (BoroPhosphoSilicate) or BSG (BoroSilicate Glass). Typically, the gate oxide layer 13c is made of $SiO_2$ or $Si_3N_4$, more typically by thermal $SiO_2$.

Further, the semiconductor device 100' may be sealed on the source metallization 10 and the first surface, respectively, except for contact pads, by a cover layer 14 of e.g. polyimide. Referring again to FIG. 1, further embodiments are explained.

As illustrated in FIG. 1, the first surface 101 of the semiconductor body 40 is in the peripheral area 120 typically covered by a dielectric layer 13a. The dielectric layer 13a may at least substantially extend to the edge 41. Accordingly, the semiconductor body 40 is protected, e.g. against moisture.

The dielectric layer 13a may be formed together with the gate dielectrics, for example as a thermal oxide. Typically, the gate dielectrics and the dielectric layer 13a are formed in separate processes.

According to an embodiment, the semiconductor body 40 further includes in the peripheral area a p-type edge termination region 17 adjoining the first semiconductor region 2 and in Ohmic connection with the source metallization 10 (for example via an outermost body region 5').

The edge termination region 17 typically acts as a JTE (Junction Termination Extension)—region and is in the following also referred to as JTE-region 17. The p-type dopant concentration in the JTE region 17 may be constant or decreasing continuously or in discrete steps with decreasing distance from the edge 41. Accordingly, a VLD (Variation of Lateral Doping) edge-termination structure may be formed.

The edge termination region 17 may be co-doped or not.

An integral value, which is obtainable by integrating the p-dopant concentration in the edge termination region 17 and/or the net p-dopant concentration in the edge termination region 17 along a vertical line across the edge termination region 17, is at least about $10^{10}/cm^2$, typically in a range from about $1*10^{11}/cm^2$ to about $1*10^{13}/cm^2$, more typically in a range from about $1*10^{11}/cm^2$ to about $1*10^{12}/cm^2$.

The dielectric layer 13a is arranged at the first surface 101 and forms a first interface 17i with the edge termination region 17 and a second interface 2i with the first semiconductor region 2.

In the illustrated cross-section, a first extension w of the first interface 17i in the horizontal direction is larger than a second extension a of the second interface 2i in the horizontal direction. The first extension w may be at least two times or even at least three times larger than the second extension a.

Furthermore, the first extension w is typically larger than a vertical extension $d_2-d_1$ of the compensation regions 6 and the trenches (50), respectively, at least in the active area 110.

The first extension w may be in a range from about 5 µm to about 400 µm, more typical in a range from about 100 µm to about 200 µm.

A vertical extension of the edge termination region 17 may be in a range from about 20 nm to about 5 µm, more typical in a range from about 500 nm to about 2 µm.

In the exemplary embodiment, the compensation regions 6 extend, in the vertical direction $e_n$ perpendicular to the first surface 101, between a first distance $d_1$ to the first surface 101 and second distance $d_2$ to the first surface 101 larger than the first distance $d_1$.

Due to the comparatively wide p-type edge termination region 17 at the first surface 101 and in Ohmic connection with the source metallization 10, a high reverse blocking voltage $V_{BR}$ can be ensured. Furthermore, non-presented numerical simulations reveal that a stable breakdown behavior can be achieved as the breakdown will occur in the active area 110. Even further, the edge termination region 17 may contribute to restore any deviation of charge compensation in the peripheral area 120 that may occur during manufacturing due to a typically higher segregation of p-type dopants compared to n-type dopants into the dielectric layer 13a during a thermal process(es).

The first semiconductor region 2 and the edge termination region 17 may surround the active area 110 when seen from above.

The first semiconductor region 2 typically forms a pn-junction, which may extend to the first surface 101, with the edge termination region 7.

Figure 4:
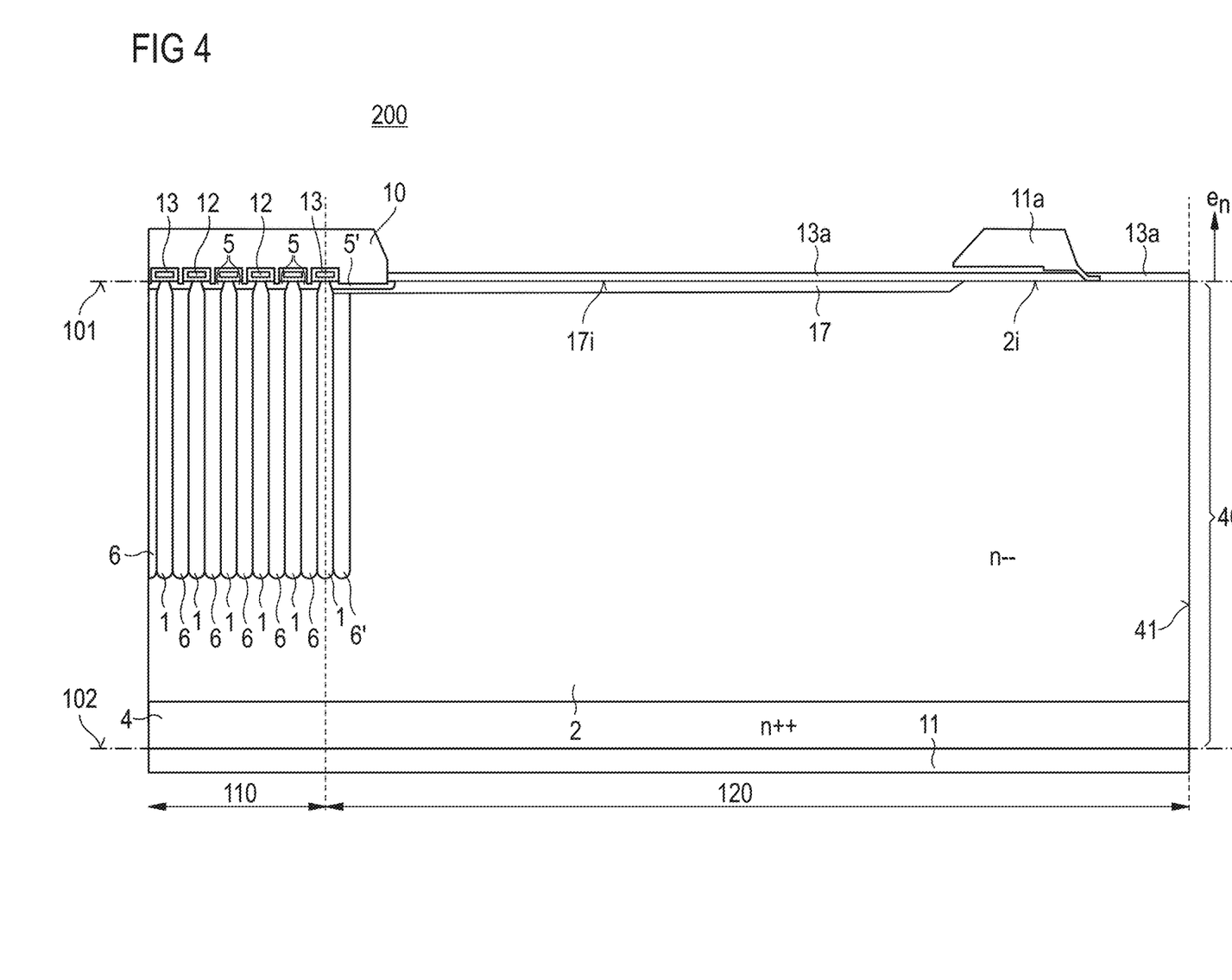
FIG. 4 illustrates a vertical cross-section through a field-effect semiconductor device according to an embodiment.

FIG. 4 illustrates a vertical cross-section through a field-effect semiconductor device 200. The semiconductor device 200 is similar to the semiconductor device 100 explained above with regard to FIGS. 1 to 3. However, the semiconductor device 200 further has a first field plate 11a in the peripheral area 120. In the exemplary embodiment, the first field plate 11a is in Ohmic connection with the drain metallization 12. In the following, the first field plate 11a is also referred to as drain field plate. Due to the first field plate 11a, the electric field distribution in the blocking-state may be further smoothed and/or a sensitivity of the semiconductor device 200 with respect to mobile charges in the dielectric layer 13a be reduced.

The drain field plate 11a is typically arranged close to the edge 41 than to the source metallization 10.

When seen from above, the drain field plate 11a typically partially overlaps with the edge termination region 17 and both interfaces 17i, 2i. This may further improve the breakdown behavior.

Furthermore, the drain field plate 11 may surround the active area 110 when seen from above.

Figure 5:
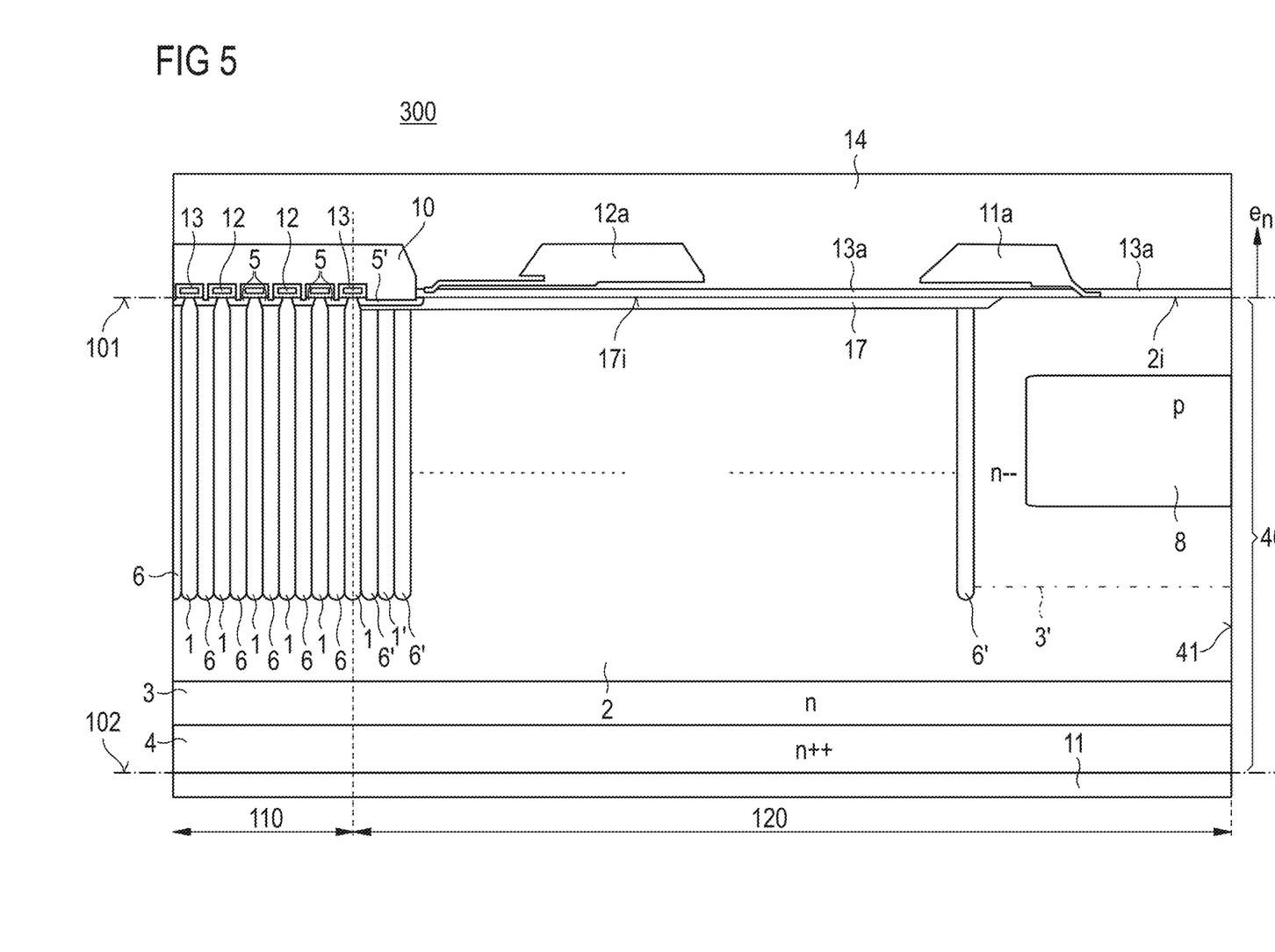
FIG. 5 illustrates a vertical cross-section through a field-effect semiconductor device according to an embodiment.

FIG. 5 illustrates a vertical cross-section through a field-effect semiconductor device 300. The semiconductor device 300 is similar to the semiconductor device 200 explained above with regard to FIG. 4. However, the semiconductor device 300 further has a second field plate 12a in the peripheral area 120.

The second field plate 12a is typically not in Ohmic connection with the semiconductor body 40. The second field plate 12a may be floating or may form a gate field plate in Ohmic connection with the gate metallization.

As illustrated in FIG. 5, the second field plate 12a is typically arranged on the first surface 101, between the field plate 11a and the source metallization 10 and closer to the active area 110 than to the (nearest) edge 41.

The field plate 11a and/or the field plate 12a may be ring-shaped when seen from above.

Further, the field plate 11a and/or the field plate 12a may be stepped as illustrated in FIG. 5, i.e., the vertical (minimum) distance of the field plates 11a and/or 12a from the first surface 101 may change substantially stepwise in a horizontal direction. The number of steps may also be higher or lower compared to the exemplary embodiment illustrated in FIG. 5.

In other embodiments, only one or even none of the field plate 11a, 12a is arranged on the first surface 101.

As illustrated in FIG. 5 by the alternating regions 1', 6', the compensation structure 1, 6, of the active area 110 may extend into the peripheral area 120 of semiconductor device 300.

In the exemplary embodiment, a plurality of p-type further compensation region 6' each of which adjoins the edge termination region 17 are arranged between a right outermost compensation region 6 and the edge 41.

Similar as in the active area 110, adjacent further compensation regions 6' are spaced apart from each other by n-type portions 1'. The dopings of the further compensation regions 6' and the n-type portions 1' may substantially correspond to the dopings of the compensation regions 6 and the drift portions 1', respectively, but may also be lower, e.g. decreasing with decreasing distance from the edge 41.

Further, the geometry of the further compensation region 6' and the n-type portions 1' may substantially correspond to the geometry of the compensation region 6 and the drift portions 1', respectively, at least below the edge termination region 17.

For sake of clarity, a broken dotted line is shown in FIG. 5 instead of showing all alternating further compensation region 6' and the n-type portions 1'.

In the exemplary embodiment, an outermost of the further compensation region 6' overlaps with the field plate 11a when seen from above and in a projection onto the first surface 101, respectively.

Furthermore, a floating p-type semiconductor region 8 forming a pn-junction with the first semiconductor region 2 may be arranged in the peripheral area 120 at least close to the edge 41. The semiconductor region 8 may be due to manufacturing, e.g. formed in a co-doped layer during a thermal process(es).

Further, an n-type field-stop region 3 may be arranged between the first semiconductor region 2 and the drain region 4. The field-stop region 3 has typically a higher (net-) doping concentration than the first semiconductor region 2 and/or a lower (net-) doping concentration than the drain region 4.

As illustrated in FIG. 5 by the dashed-dotted line 3', the alternating regions 1, 6, 1', 6' and the trenches for the compensation region 6 and the further compensation region 6', respectively, typically extend through the first semiconductor region 2, more typically at least partially into field-stop region 3.

Alternatively or in addition, the semiconductor body 40 may include a higher n-doped channel-stop region (not shown) adjoining the first semiconductor region 2. Typically, the channel-stop region extends to the first surface 101 and is arranged between the edge 41 and the edge termination region 17. The channel-stop region may extend substantially to the edge 41. Further, the channel-stop region 8 may extend in a vertical direction from the first surface 101 to the field-stop region 3 or even to the drain region 4.

Due to the channel-stop region, the electric field in the off-state does not, or at least almost does not, extend to the edge 41. Accordingly, a low leakage current is ensured, as crystal defects which may be caused by sawing are shielded by the highly doped channel-stop region.

Alternatively or in addition, the semiconductor body 40 may include a p-doped channel-stop region adjoining the first semiconductor region 2 (not shown), typically extending to the first surface 101, spaced apart from the edge termination region 17, and arranged between the edge 41 and the edge termination region 17.

Even further, semiconductor device 300 may have a cover layer 14 and/or interlayer dielectric(s) 13b, 13d as explained above with regard to FIG. 3.

Figure 6:
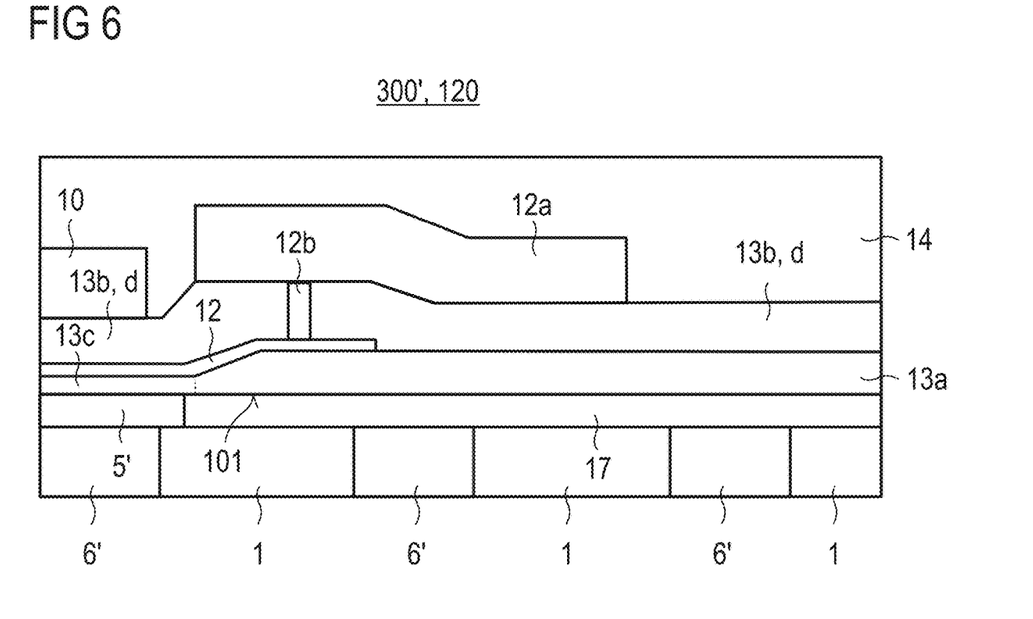
FIG. 6 illustrates an enlarged vertical section of a peripheral area of a field-effect semiconductor device similar to the field-effect semiconductor device illustrated in FIG. 5 according to an embodiment.

This is illustrated in more detail in FIG. 6 showing an enlarged vertical section of an upper inner right portion of a peripheral area 120 of a field-effect semiconductor device 300' which is similar to the field-effect semiconductor device 300. However, the stepped gate field plate 12a of the semiconductor device 300' is differently shaped.

Further, the gate field plate 12a of semiconductor device 300' may be arranged in a region where an outermost portion of the gate dielectric layer 13c, portions of which may form the gate dielectrics in the active area, vertically widens towards the edge 41 to a higher thickness of the dielectric layer 13a. For example, an inner portion the gate field plate 12a may overlap with a vertically widening portion of the dielectric layer 13a.

As illustrated in FIG. 6, the gate field plate 12a may be connected via a through contact 12b to a conductive layer 12, e.g. made of doped poly-Si. Portions of the conductive layer 12 may form the gate electrodes in the active area.

The field-effect semiconductor devices explained above with regard to the above Figures have in common that they include a semiconductor body 40 having a first surface 101, an edge 41 delimiting the semiconductor body 40 in a direction substantially parallel to the first surface 101, an active area 110, a peripheral area 120 arranged between the active area 110 and the edge 41, and a co-doped n-type first semiconductor region 2 extending in the peripheral area 120 to the first surface 101. A first metallization 10 is arranged on the first surface 101. A second metallization 11 is arranged opposite the first metallization 10 and in Ohmic connection with the first semiconductor region 2. In the active area 110, the semiconductor body 40 further includes a plurality of n-type drift portions 1 alternating with p-type compensation regions 6. The drift portions 1 are in Ohmic connection with the first semiconductor region 2. The compensation regions 6 are in Ohmic connection with the first metallization 10 and have, in a vertical direction perpendicular to the first surface 101, a vertical extension d2−d1. In the peripheral area 120, the semiconductor body 40 further includes a p-type edge termination region 17 in Ohmic connection with the first metallization 10. In a vertical cross-section, which is perpendicular to the first surface 101, the edge termination region 17 has at the first surface 101, in a horizontal direction parallel to the first surface 101, a first horizontal extension w which is larger than the vertical extension d2–d1 of the compensation regions 6.

The doping relations may, however, also be reversed.

Typically, the field-effect semiconductor devices include a dielectric layer 13a in the peripheral area 120. The dielectric layer 13a is arranged at the first side 101, completely covers the edge termination region 17, forms a first interface 17i with the edge termination region 17, and forms a second interface 2i with the first semiconductor region 2 having a horizontal extension a which is lower than first horizontal extension w.

In the following, methods for manufacturing such field-effect semiconductor devices are explained.

FIGS. 7 to 11 illustrate a method for forming a field-effect semiconductor device 100 according to several embodiments. These figures show vertical cross-sections through a semiconductor body 40 during or after particular method steps.

Figure 7:
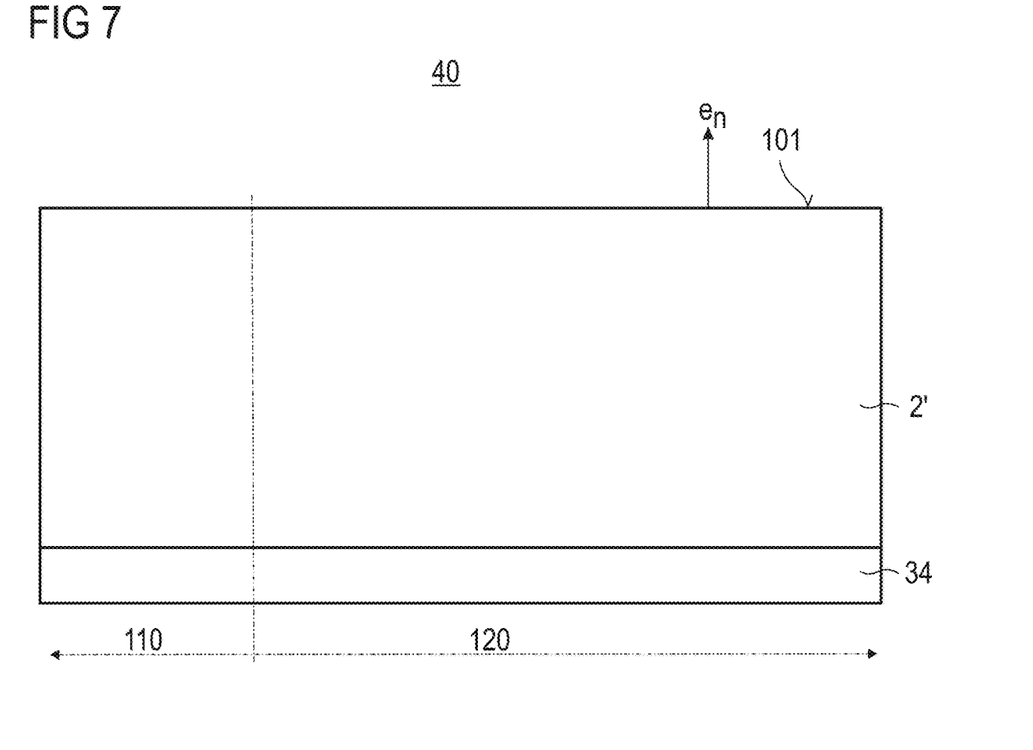
FIGS. 7 to 11 illustrate vertical cross sections through a wafer during method steps of a method for forming a field-effect semiconductor device according to embodiments.

In a first process, a semiconductor body 40, typically a Si-wafer, having an upper side 101, typically a plane upper surface, and a backside side (not shown in the following figures) arranged opposite to the upper side 101 is provided. The normal direction of main surface 101 defines a vertical direction $e_n$.

As illustrated in FIG. 7, the semiconductor body 40 typically includes a first semiconductor layer 2' which extends to the upper side 101. The first semiconductor layer 2' is a substantially compensated semiconductor layer 2 of a semiconductor material which is co-doped with n-type dopants and p-type dopants. Typically, the first semiconductor layer 2' is a substantially compensated layer 2' of silicon which is co-doped with boron atoms as p-type dopants and antimony or arsenic atoms as n-type dopants.

The semiconductor layer 2' may be formed on an n-doped silicon substrate 34 that may provide in the semiconductor device to be manufactured a highly n-doped drain region (4) and/or an n-type field-stop region (3) arranged on the drain region (4).

Forming the semiconductor layer 2' typically includes several cycles of disposing on the silicon substrate 34 a silicon semiconductor layer, and implanting the n-type dopants and the p-type dopants into the disposed silicon semiconductor layer so that an integrated concentration of the n-type dopants is substantially equal to the integrated concentration of the p-type dopants of the disposed silicon semiconductor layer.

Thereafter, an annealing is used to form the substantially compensated silicon semiconductor layer 2'. The annealing is typically performed in an inert atmosphere.

For example, a nearly intrinsic Si epitaxial layer may be grown on an n+ Si substrate or a low doped n-type layer with an optional field stop layer formed on the n+ Si substrate, for example as a first epitaxial layer.

Next, p-type dopant atoms such as boron atoms are implanted into the top surface of the Si epitaxial layer. Photomasking is not needed during the boron implantation. However, a photo mask may be used for boron implantation, e.g. to generate a better field stop in the vertical direction. After implantation, the Si epitaxial layer contains a sub-layer including p-type dopant atoms.

Additionally, n-type dopant atoms such as antimony atoms or arsenic atoms are implanted (as ions) into the top surface of the Si epitaxial layer. The same dose may be used for the n-type dopant atoms as for the p-type dopant atoms e.g. between $10^{12}$ to $10^{14}$ atoms/cm$^2$ to fully compensate the Si epitaxial layer with regard to p-type dopant atoms and n-type dopant atoms. The doping doses may also take into account any pre-doping of the Si epitaxial layer. Photomasking again is not needed but may be used during the n-type dopant implantation, and the Si epitaxial layer contains a sub-layer of implanted n-type dopant atoms. The p-type and n-type implanted sub-layers can be at the same depth, or at different depths. Furthermore, different p-dopant and n-dopant implantations in different depths of the Si epitaxial layer may be used, for example with varying doses to control the vertical profile of the semiconductor device to be manufactured. By controlling the vertical profile as desired, the electric field profile is correspondingly controlled.

Thereafter, a further Si epitaxial layer may be grown on the original Si epitaxial layer and p-type and n-type implantation, at the same or different doses as before, are performed again for the further Si epitaxial layer.

The epi growth and implantation processes can be repeated a desired number of times until a suitably thick multi-layered epitaxial layer with vertically stacked n-type and p-type dopant sub-layers is formed. With such a multilayered epitaxy, the implantation doses can be varied in each separate Si epitaxial layer which is then followed by a diffusion of the individual implanted layers until the entire multilayered epi is penetrated with dopants.

The diffusion constants of the implanted p-dopant and n-dopant atoms typically differ by at least 20%, more typically by at least 50% or even by at least 100%. For example, boron diffuses about two times faster than arsenic and antimony in silicon. The difference in the diffusion constants may be taken into account for determining the number and energy of implantation steps. For example, one boron implantation and two arsenic or antimony implantations with different implantation energy may be used for the Si epitaxial layers.

An alternative to the multilayered epi process described above involves using a single continuous epi layer and providing doping gas currents that form an epi material which is fully compensated as described above. In either case, a homogenously co-doped epi layer 2' is achieved. Alternatively, the doses of one or more of the n-type and/or p-type implantations can vary over at least a part of the vertical depth of the co-doped epi layer 2' so that a corresponding vertical profile is defined as previously described herein.

In one embodiment, the co-doped epi layer 2' is doped homogenously with the n-type dopant atoms and the p-type dopant atoms in the horizontal direction extending parallel to the upper side 101 so that the epi layer 2' has a dopant variation of less than 3% or more preferably less than 1% in the horizontal direction.

The epi layer 2' can be doped non-homogenously in the vertical direction so that the dopant variation in the vertical direction is greater than 1% and typically less than 50%. This way, there is little variation in the dopant concentration in the horizontal direction and a much greater variation in the vertical direction. As a result, certain regions of the co-doped epi layer 2' can be doped more heavily that others e.g. to provide a breakdown structure within the drift zone of the device. Indeed, a doping variation in the vertical direction may be desirable to increase the breakdown robustness of the device. For example, the epi layer(s) in about half the depth of the co-doped epi layer 2' may be doped more heavily than the lower epi layers. In each case, the co-doped epi material 100 is at least nearly fully compensated in that a dopant concentration difference of less than 10 to 20% is realized throughout the entire volume of semiconductor layer 2'.

After providing the wafer 40 including the substantially compensated semiconductor layer 2, an active area 110 and a peripheral area 120, which typically surround the active area 120 when seen from above, may be defined.

Figure 8:
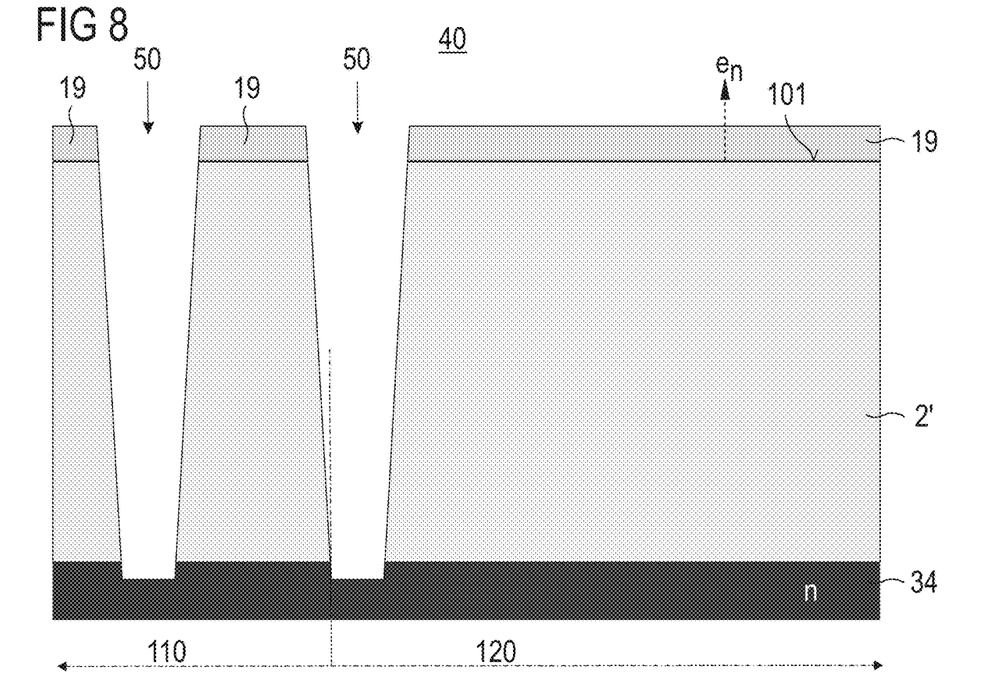

FIG. 8 illustrates the structure, after forming in the active area 110 and the peripheral area 120 vertical trenches 50 from the upper side 101 into the substantially compensated semiconductor layer 2'. For sake of clarity, only one trench 50 of the active area 110 and one trench 50 of the peripheral area 120 are shown in FIG. 8. As explained above, a plurality of trenches 50 is typically formed in the active area 110 while none, one, a few or a plurality of trenches 50 may be formed in the peripheral area 120.

The trenches 50 may partially extend into or even through the substantially compensated semiconductor layer 2'.

The trenches 50 are typically formed by etching using an etching mask 19 formed on the upper side 101.

As illustrated in FIG. 8, the trenches 50 may have tapered sidewalls.

Thereafter, the etching mask 19 may be removed.

Thereafter, the trenches 50 may be filled with a substantially intrinsic semiconductor material 60, monocrystalline silicon in the exemplary embodiment.

Figure 9:
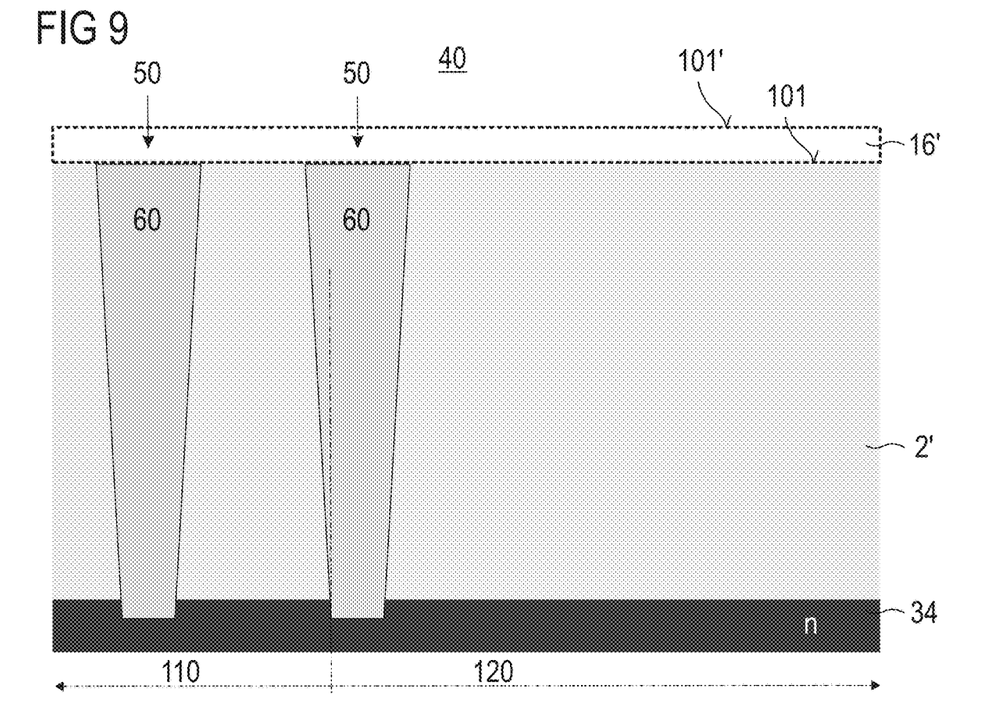

Filling the trenches 50 may include selective epitaxy and a subsequent planarization, for example chemical mechanical polishing (CMP).

The resulting structure is illustrated in FIG. 9 which also shows an optional substantially intrinsic semiconductor layer 16' at the upper side 101. The substantially intrinsic semiconductor layer 16' may be deposited on the upper side 101 after filling the trenches 50, typically as monocrystalline silicon layer.

Figure 10:
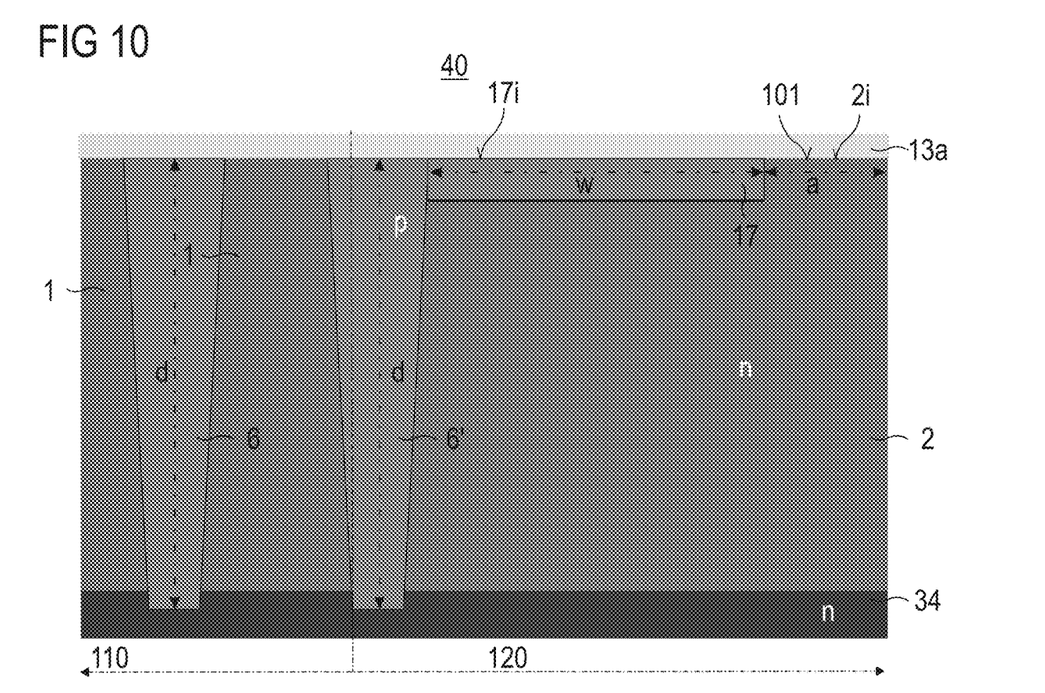
Figure 11:
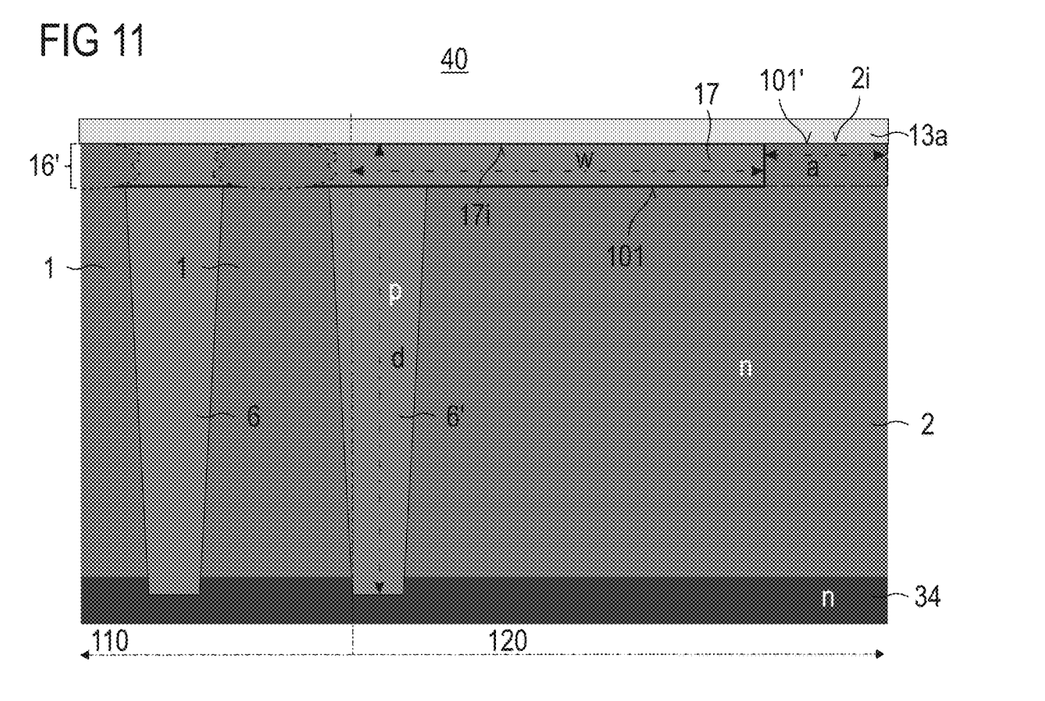

Thereafter, an annealing process in an oxidizing atmosphere may be carried out. Accordingly, a dielectric layer 13a may be formed on the upper side 101 and more p-type dopants than n-type dopants are diffused from the substantially compensated semiconductor layer 2' into the intrinsic semiconductor material 60 of the trenches 50. The latter is due to the higher diffusivity of the p-type dopants compared to the n-type dopants at the typical annealing temperatures of for example about 950° C. to about 1150° C. Thereby, p-type compensation regions 6, 6' are formed in the trenches 50 which are separated from each other by respective n-type drift portions 1 as illustrated in FIG. 10 and FIG. 11.

Compared to forming the compensation structure 1, 6, 1', 6' based on implanting p-type dopants into an n-type semiconductor layer, the herein used manufacturing allows reducing manufacturing variations of the compensation structure 1, 6, 1', 6' with regard to the compensation.

Annealing may last several hours.

Using a wet oxidizing atmosphere may reduce annealing time and enhance dopant separation. This is due to a selective increase of the mobility of boron in silicon under these circumstances.

FIG. 10 and FIG. 11 correspond to resulting structures without the substantially intrinsic semiconductor layer 16 (FIG. 10) and with the substantially intrinsic semiconductor layer 16 (FIG. 11) after introducing p-type dopants (e.g. boron atoms) into a semiconductor zone 17 of the peripheral area 120 at the upper side 101. This may be achieved by masked implantation, e.g. of boron with an implantation dose in the order of $10^{12}/cm^2$ and subsequent further annealing.

Two or more p-implantation may be used if a horizontally varying p-doping is desired in the semiconductor zone 17.

In the embodiment illustrated in FIG. 10, the dielectric layer 13a is formed at the upper side 101.

In the embodiment illustrated in FIG. 11, the dielectric layer 13a is formed at an upper side 101' of the substantially intrinsic semiconductor layer 16'.

As illustrated in FIG. 11 by the dashed curves, n-dopants may also be implanted into the substantially intrinsic semiconductor layer 16'.

The method is performed so that the semiconductor zone 17, which may form an edge termination region in the semiconductor device to be manufactured, and the dielectric layer 13a form an interface 17i having, in the vertical cross-section, a horizontal extension w which is larger than the vertical extension d of the trenches 50 and a horizontal extension a of an interface 2i formed the dielectric layer 13a and an outermost n-type portion 2 of the compensated semiconductor layer 2'.

Instead of forming the dielectric layer 13a and the compensation regions 6, 6' in a common process, the dielectric layer 13a may be formed in a separate process, e.g. by depositing.

During the thermal process used for forming the compensation regions 6, 6', dopants, in particular boron atoms may diffuse into the dielectric layer 13a.

This may result in a doping imbalance in the peripheral area 120. The imbalance may be compensated by the edge termination region 17.

Further, effective p-type sub regions and/or effective n-type sub regions may be formed next to the upper side 101 in the compensated semiconductor layer 2'. This is, however, not illustrated in FIGS. 10, 11 (see the floating p-type semiconductor region 8 in FIG. 5).

In subsequent processes, body regions, source regions, body contact regions and/or p+ type Si-contact regions may be formed next to the sides 101, 101'.

Further, one or more insulated gate electrodes may be formed next to the sides 101, 101'.

Thereafter, interlayer dielectric(s) and a source metallization in Ohmic connection with the compensation regions 6 may be formed on the sides 101, 101' and a drain metallization may be formed opposite to the source metallization in Ohmic connection with the drift portions 1.

In so doing, compensation semiconductor devices, for example compensate MOSFETs, with a well-balanced doping relation may be manufactured in an efficient an reliable way.

Further, a first field plate in Ohmic connection with the drain metallization and opposite the drain metallization and/or a second field plate arranged on the first side 101 and closer to the active area 110 than to an edge, typically later formed in a singulating process, may be formed in the peripheral area 120.

According to an embodiment of method for forming a field-effect semiconductor device, the method includes providing a substantially compensated semiconductor layer comprising an upper side and a semiconductor material which is co-doped with n-type dopants and p-type dopants. An active area and a peripheral area surrounding the active area when seen from above are defined. At least in the active area, trenches are formed from the upper side into the compensated semiconductor layer. The trenches are filled with a substantially intrinsic semiconductor material. Annealing in an oxidizing atmosphere is used to form a dielectric layer above the trenches and to diffuse more p-type dopants than n-type dopants into the intrinsic semiconductor material in the trenches, thereby forming a plurality of p-type compensation regions in the trenches which are separated from each other by respective n-type drift portions. P-type dopants are introduced at least into a zone of the peripheral area having, in a horizontal direction parallel to the upper side, a horizontal extension which is larger than an extension of the trenches in a vertical direction perpendicular to the upper side.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under," "below," "lower," "over," "upper" and the like are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for forming a field-effect semiconductor device, the method comprising:
   providing a wafer comprising an upper side and a substantially compensated semiconductor layer extending to the upper side and comprising a semiconductor material which is co-doped with n-type dopants and p-type dopants, wherein an active area and a peripheral area laterally surrounding the active area are defined in the wafer and trenches are provided in the active area extending from the upper side, the trenches comprising, in a vertical direction perpendicular to the upper side, a vertical extension;
   filling the trenches with a substantially intrinsic semiconductor material;
   diffusing more p-type dopants than n-type dopants from the substantially compensated semiconductor layer into the substantially intrinsic semiconductor material of the trenches to form a plurality of p-type compensation regions in the trenches which are separated from each other by respective n-type drift portions;
   forming a dielectric layer on the upper side of the wafer; and
   introducing p-type dopants at least into a semiconductor zone of the peripheral area, so that the semiconductor zone and the dielectric layer form an interface having, in a vertical cross-section and in a horizontal direction parallel to the upper side of the wafer, a horizontal extension which is larger than the vertical extension of the trenches.

2. The method of claim 1, wherein diffusing more p-type dopants than n-type dopants and forming the dielectric layer comprises a common annealing process in an oxidizing atmosphere.

3. The method of claim 2, wherein the oxidizing atmosphere is a wet oxidizing atmosphere.

4. The method of claim 2, wherein filling the trenches comprising selective epitaxy.

5. The method of claim 2, further comprising:
   prior to annealing in the oxidizing atmosphere, disposing a substantially intrinsic semiconductor layer on the upper side of the wafer.

6. The method of claim 1, wherein providing the wafer comprises:
   disposing on a silicon substrate at least one silicon semiconductor layer.

7. The method of claim 1, wherein providing the wafer comprises:
   implanting the n-type dopants and/or the p-type dopants into at least one silicon semiconductor layer disposed on a silicon substrate so that an integrated concentration of the n-type dopants of the at least one silicon semiconductor layer is substantially equal to an integrated concentration of the p-type dopants of the at least one silicon semiconductor layer.

8. The method of claim 7, further comprising:
   after the implanting, annealing the at least one silicon semiconductor layer to form the substantially compensated semiconductor layer.

9. The method of claim 1, further comprising:
   after filling the trenches, disposing a substantially intrinsic semiconductor layer on the upper side of the wafer.

10. The method of claim 1, wherein introducing the p-type dopants comprises implanting.

11. The method of claim 1, wherein the p-type dopants are introduced by a thermal process.

12. The method of claim 1, wherein the semiconductor material comprises monocrystalline silicon, wherein the substantially intrinsic semiconductor material comprises monocrystalline silicon, wherein the p-type dopants of the substantially compensated semiconductor layer are boron atoms, wherein the p-type dopants which are introduced into the semiconductor zone are boron atoms, and/or wherein the n-type dopants are antimony or arsenic atoms.

13. The method of claim 1, further comprising:
   forming a source metallization in Ohmic connection with the p-type compensation regions.

14. The method of claim 1, further comprising:
   forming in the peripheral area a second field plate arranged on the first side and between a first field plate and a source metallization, not in Ohmic connection with the semiconductor material, and laterally overlapping with the interface.

15. A method for forming a field-effect semiconductor device, the method comprising:
   filling trenches formed in an active area of a wafer with a substantially intrinsic semiconductor material, the wafer comprising a substantially compensated co-doped semiconductor layer extending to an upper side of the wafer and a peripheral area laterally surrounding the active area, the trenches extending from the upper side to a depth in the wafer;
   diffusing more p-type dopants than n-type dopants from the substantially compensated co-doped semiconductor layer into the substantially intrinsic semiconductor material which fills the trenches, to form a plurality of p-type compensation regions in the trenches which are separated from each other by respective n-type drift portions;

forming a dielectric layer on the upper side of the wafer; and introducing p-type dopants at least into a semiconductor zone of the peripheral area, so that the semiconductor zone and the dielectric layer form an interface having a horizontal extension which is greater than the depth of the trenches.

16. The method of claim 15, wherein diffusing more p-type dopants than n-type dopants and forming the dielectric layer comprises a common annealing process in an oxidizing atmosphere.

17. The method of claim 16, wherein the oxidizing atmosphere is a wet oxidizing atmosphere.

18. The method of claim 16, further comprising:

prior to annealing in the oxidizing atmosphere, disposing a substantially intrinsic semiconductor layer on the upper side of the wafer.

19. The method of claim 15, further comprising:

after filling the trenches, disposing a substantially intrinsic semiconductor layer on the upper side of the wafer.

20. The method of claim 15, further comprising:

forming a source metallization in Ohmic connection with the p-type compensation regions.

* * * * *